United States Patent
Casset et al.

(10) Patent No.: US 7,625,772 B2
(45) Date of Patent: Dec. 1, 2009

(54) METHOD FOR MAKING AN ELECTROMECHANICAL COMPONENT ON A PLANE SUBSTRATE

(75) Inventors: Fabrice Casset, Tencin (FR); Cedric Durand, Saint Martin d'Heres (FR); Pascal Ancey, Revel (FR)

(73) Assignee: Commissariat a l'Energie Atomique, Paris (FR)

( * ) Notice: Subject to any disclaimer, the term of this patent is extended or adjusted under 35 U.S.C. 154(b) by 238 days.

(21) Appl. No.: 11/904,859

(22) Filed: Sep. 27, 2007

(65) Prior Publication Data

US 2008/0076211 A1    Mar. 27, 2008

(30) Foreign Application Priority Data

Sep. 27, 2006    (FR)    .................... 06 53975

(51) Int. Cl.
*H01L 21/00*    (2006.01)
(52) U.S. Cl. .............. 438/50; 438/52; 438/53; 438/487; 257/E21.003; 257/E21.201
(58) Field of Classification Search ........... 438/50, 438/52, 53, 478; 257/E21.003, E21.201
See application file for complete search history.

(56) References Cited

U.S. PATENT DOCUMENTS

| | | | | |
|---|---|---|---|---|
| 5,583,362 | A * | 12/1996 | Maegawa | 257/347 |
| 6,355,498 | B1 * | 3/2002 | Chan et al. | 438/48 |
| 6,495,403 | B1 * | 12/2002 | Skotnicki et al. | 438/157 |
| 6,873,088 | B2 | 3/2005 | Skotnicki et al. | 310/328 |
| 7,196,451 | B2 * | 3/2007 | Monfray et al. | 310/311 |
| 2002/0189350 | A1 * | 12/2002 | Tu | 73/504.04 |
| 2005/0199970 | A1 | 9/2005 | Monfray et al. | 257/414 |
| 2009/0152998 | A1 * | 6/2009 | Abele et al. | 310/365 |

FOREIGN PATENT DOCUMENTS

| | | |
|---|---|---|
| DE | 102 26 027 A1 | 12/2003 |
| FR | 2 823 032 | 10/2002 |
| FR | 2 857 952 | 1/2005 |
| FR | 2 872 501 | 1/2006 |
| FR | 2 881 416 | 8/2006 |

OTHER PUBLICATIONS

French Preliminary Search Report, dated Jun. 6, 2007, French Application No. 06 53975.
Jurczak, et al., "Silicon-on-Nothing (SON) —an Innovative Process for Advanced CMOS", IEEE Transactions on Electron Devices, vol. 47, No. 11, pp. 2179-2187 (Nov. 2000).
Yao, et al., "High Tuning-Ratio MEMS-Based Tunable Capacitors for RF Communications Applications", Technical Digest, Solid State Sensor and Actuator Workshop, Hilton Head Island, SC, pp. 124-127 (Jun. 1998).

* cited by examiner

*Primary Examiner*—Michael Trinh
(74) *Attorney, Agent, or Firm*—Nixon Peabody LLP

(57) ABSTRACT

Method for making an electromechanical component on a plane substrate and comprising at least one structure vibrating in the plane of the substrate and actuation electrodes. The method comprises at least the following steps in sequence:
  formation of the substrate comprising one silicon area partly covered by two insulating areas,
  formation of a sacrificial silicon and germanium alloy layer by selective epitaxy starting from the uncovered part of the silicon area,
  formation of a strongly doped silicon layer by epitaxy, comprising a monocrystalline area arranged on said sacrificial layer and two polycrystalline areas arranged on insulating areas,
  simultaneous formation of the vibrating structure and actuation electrodes, by etching of a predetermined pattern in the monocrystalline area designed to form spaces between the electrodes and the vibrating structure,
  elimination of said sacrificial silicon and germanium alloy layer by selective etching.

8 Claims, 3 Drawing Sheets

METHOD FOR MAKING AN ELECTROMECHANICAL COMPONENT ON A PLANE SUBSTRATE

CROSS-REFERENCE TO RELATED PATENT APPLICATION OR PRIORITY CLAIM

This application claims the benefit of a French Patent Application No. 06-53975, filed on Sep. 27, 2006, in the French Intellectual Property Office, the disclosure of which is incorporated herein in its entirety by reference.

FIELD OF THE INVENTION

The invention relates to a method for making an electromechanical component on a plane substrate and comprising at least one structure vibrating in the plane of the substrate and actuation electrodes.

The invention is more particularly applicable to manufacturing of microelectromechanical systems (MEMS) or nanoelectromechanical systems (NEMS) comprising a vibrating structure with displacement in the plane of the substrate.

The development of increasingly small and high performance portable units is motivating the search for new components to perform new functions. In radio frequency applications, and particularly mobile telephony, portable PC, communicating object type applications, etc., micro or nano electromechanical systems (MEMS or NEMS) are credible alternatives to <<conventional>> microelectronic components due to their integration and theoretical performances.

The SON (<<Silicon on Nothing>>) technology can be used to make such MEMS/NEMS. The SON technology consists globally of epitaxying a sacrificial layer of a few nanometers thick (typically 20 nm to 50 nm) made of silicon and germanium SiGe alloy (for example with 30% germanium) and silicon is then epitaxied with the characteristic of being monocrystalline above the silicon and germanium layer. The silicon and germanium layer is then selectively etched with respect to the silicon. This operation can result in local suspended silicon areas (<<On Nothing>>), well adapted to the production of MEMS/NEMS.

The major advantage of the SON technology, particularly compared with the conventional SOI (<<Silicon on Insulator>>) technology is the possibility of working locally on a standard wafer, with an active or local suspended area. The result is an important gain in terms of cost, silicon on insulator SOI wafers being much more expensive compared with the cost of wafers used in the SON technology.

In general, MEMS/NEMS manufacturing methods encompass the production of electronic circuits and transistors. MEMS/NEMS can thus be made after the circuits and transistors (<<above IC>> production) or at the same time. In the first case, the method for making MEMS/NEMS has the constraint that it must not damage the circuits. It is an <<above IC>> method limited in terms of materials, particularly no gold or copper, and temperature, and particularly not hotter than 350° C. which usually limits the quality of the materials used. For example, silicon oxide $SiO_2$, silicon nitride SiN, silicon and germanium SiGe alloy are not as good if the deposition temperature is low. In particular, the result is that it is impossible to obtain monocrystalline silicon.

In the second case, the MEMS/NEMS production method must be compatible with the method for making transistors. For example, the document US 2005/0199970 describes production of an electromechanical component of the vibrating beam resonator type using the SON technology. As shown in FIG. 1, the resonator 10 comprises a beam 11 vibrating <<out of the plane>>, in other words along a direction perpendicular to a plane substrate 12, on which the beam 11 is made. In this case, the substrate 12 comprises an active area 13 made of strongly doped silicon, that will act as an actuation electrode for the beam 11 and that cooperates with detection and actuation electrodes 14 made after the vibrating beam 11 above it. In FIG. 1, the vibrating beam 11 may be made for example from monocrystalline silicon and the resonator 10 comprises three electrodes 14, approximately in the shape of a bridge, overlapping the beam 11 above the active area 13 of the substrate 12.

Another example embodiment of a method for making a MEMS/NEMS using the SON technology is described in document FR 2 823 032. As shown in FIG. 2, the method consists of forming a beam 11 type resonator 10 vibrating <<out of the plane>>, made above a substrate 12 comprising an active area 13, acting as an actuation electrode. However, the method described in the above document is very reducing, to the extent that it only considers a resonator of the vibrating beam 11 type anchored at its two ends 11a, 11b and with limited performances because it acts only in bending. Furthermore, the vibrating beam 11 has an <<out of the plane>> vibration (displacement perpendicular to the substrate), involving the production of detection and actuation electrodes using steps additional to the production of the vibrating beam 11. The result is an cost for these additional technological steps.

Another conventional method for making capacitive electrodes is to make components vibrating <<out of the plane>> and requiring three different steps during production, namely production of the fixed electrode (usually on the substrate), production of a sacrificial layer and production of a mobile electrode (mobile component).

Nevertheless, there are variable capacitances operating <<in the plane>> (displacement parallel to the substrate) to simplify production and only requiring two steps, namely production of the sacrificial layer and at the same time production of the fixed electrode and the mobile electrode. For example, this is the case of a variable capacitance dependent on variation of the area developed by Yao, Park and DeNatale in the article <<High tuning ratio MEMS based tuneable capacitors for RF communications applications>> (Tech. Digest, Solid State Sensor and Actuator Workshop, pp 124-7, 1998). The structure is composed of a line of fixed interdigitised combs, and another line of mobile interdigitised combs. Application of an electrostatic force will cause a lateral displacement of the mobile part and the effect of the movement is to vary the facing surfaces of the combs and therefore the capacitance.

However, such a structure is conventionally made from an SOI (Silicon on Insulator) substrate, that can be used to obtain a monocrystalline silicon component. But SOI substrates have the major disadvantage that they are very expensive. Furthermore, variable capacitances are usually made using cold or <<above IC>> technologies (temperature limited to 400° C.) that result in constituents with a low mechanical quality (metals such as gold, AlSi, etc.) and that store charges that can parasite their behaviour (nitride, low temperature oxide, etc.).

PRESENTATION OF THE INVENTION

Thus there is a need to overcome the above mentioned disadvantages and to define a method for making an electromechanical component, and particularly a component of the MEMS/NEMS type, that is simple to make, inexpensive and in particular can be used to make an electromechanical component with an optimal performance in terms of operating characteristics.

A method according to an embodiment is characterised in that the method comprises at least the following steps in sequence:
- formation of the substrate comprising at least one silicon area provided with an upper surface at least partly covered by one insulating area,
- formation of a sacrificial silicon and germanium alloy layer by selective epitaxy starting from the uncovered part of the upper surface of the silicon area,
- formation of a silicon layer with a predetermined thickness by epitaxy, comprising at least one monocrystalline area arranged on said sacrificial layer, and at least one polycrystalline area arranged on said insulating area,
- simultaneous formation of the vibrating structure and actuation electrodes, by etching of a predetermined pattern in the monocrystalline area designed to form spaces between the electrodes and the vibrating structure,
- elimination of said sacrificial layer made of silicon and germanium alloy, by selective etching.

According to one development of the invention, the silicon layer can be strongly doped.

According to another development of the invention, the thickness of the vibrating structure and the electrodes of the electromechanical component can be of the order of 100 nm to 600 nm.

According to one particular embodiment of the invention, the method can comprise a step to make an encapsulation cover for the vibrating structure of the electromechanical component.

The step to make the encapsulation cover can comprise the following steps after simultaneous formation of the vibrating structure and electrodes by etching:
- formation of a second sacrificial silicon and germanium alloy layer, by epitaxy,
- formation of a monocrystalline silicon layer by epitaxy, intended to form the encapsulation cover,
- formation of a plurality of orifices by etching in the cover,
- elimination of first and second sacrificial silicon and germanium alloy layers by selective etching through said orifices,
- formation of a layer made of a closing off material on the cover.

The method can comprise formation of an additional undoped silicon layer by epitaxy starting from the first silicon layer, before the simultaneous formation of the vibrating structure and the electrodes.

The method can comprise the formation of a metal/oxide semiconductor transistor, at the same time as the vibrating structure and the electrodes.

The method can comprise the formation of variable capacitances at the same time as the vibrating structure and the electrodes.

BRIEF DESCRIPTION OF THE DRAWINGS

Other advantages and characteristics will become clearer after reading the following description of particular embodiments of the invention given as non-limitative examples and represented in the appended drawings in which.

DETAILED PRESENTATION OF PARTICULAR EMBODIMENTS

With reference to FIGS. 3 to 12, a manufacturing method for making an electromechanical component 10 is intended particularly for the manufacture of MEMS or NEMS components of the resonator type (FIG. 7), comprising a vibrating structure and actuation electrodes, designed to entrain displacement of the vibrating structure in the plane of the substrate on which the component is made, namely parallel to the substrate.

The method consists of making actuation electrodes at the same time as the vibrating structure of the component, so that the electrodes and the vibrating structure are in the same plane parallel to the substrate. The vibrating structure can then move in the plane of the substrate and may be any type of shape and not only a beam acting in bending, which in particular improves its performances.

Figure 1:
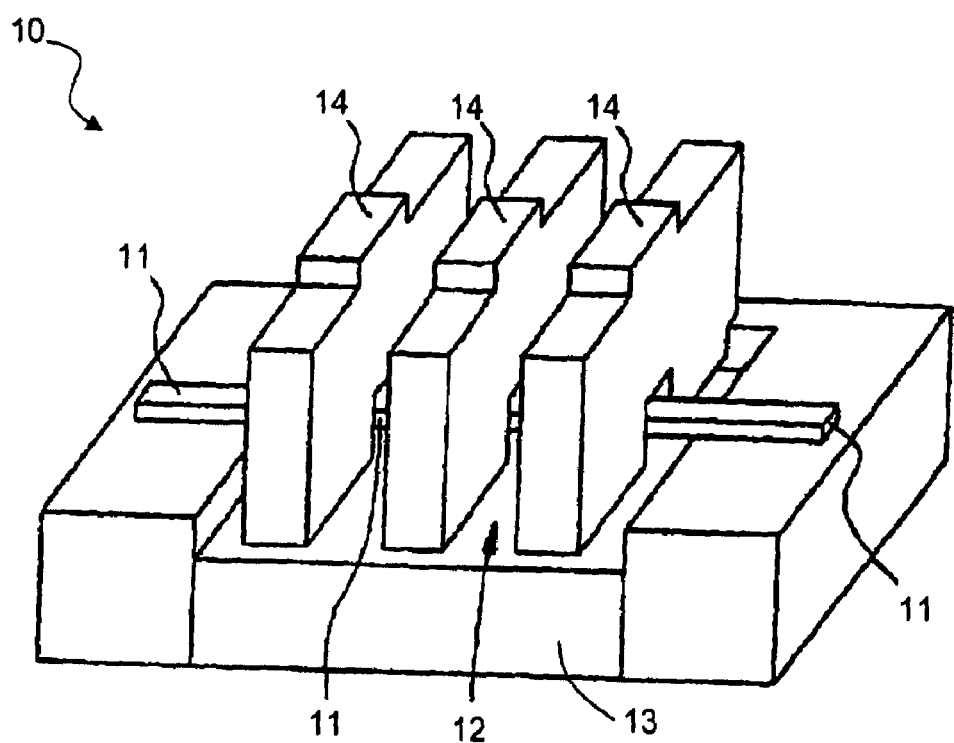
FIGS. 1 and 2 each show an electromechanical component made using the known SON technology.
Figure 2:
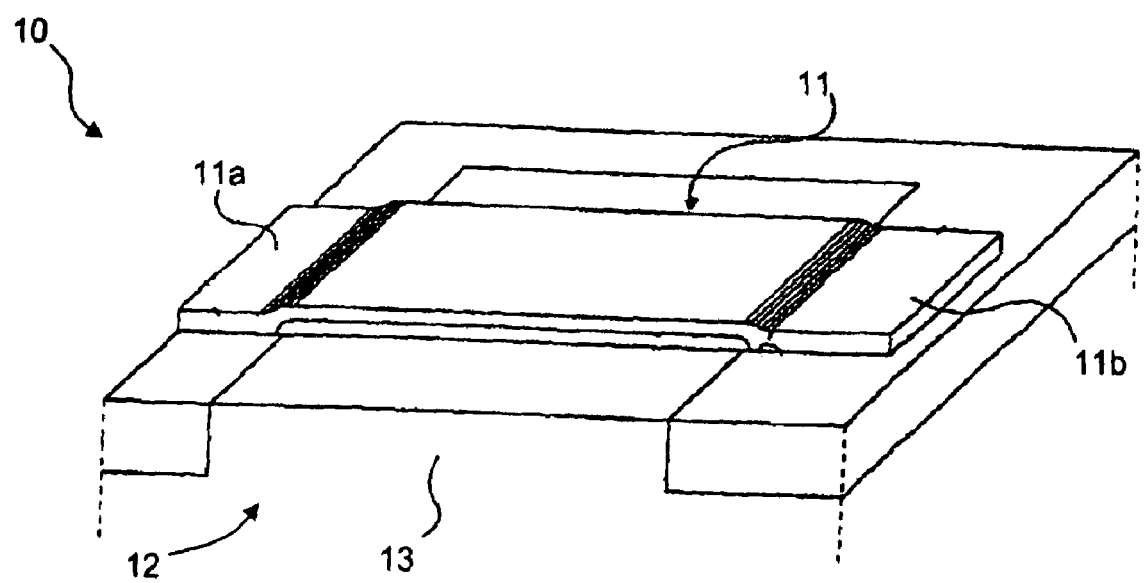
Figure 3:
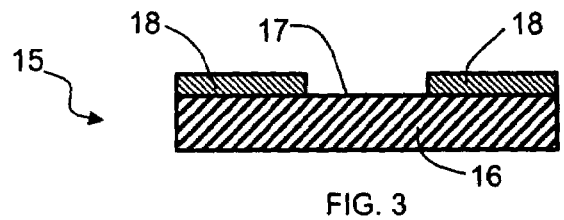
FIGS. 3 to 7 show front sectional views representing different successive steps in a method for making an electromechanical component according to an embodiment.

One particular embodiment of a resonator type MEMS/NEMS component 10 will now be described with more detail with reference to FIGS. 3 to 7. In FIG. 3, the first step in the method consists of forming a plane substrate 15, for example comprising a preferably non-conducting silicon area 16, with an upper surface 17 partially covered for example by two insulating areas 18 for example consisting of a thermal oxide. The insulating areas 18 may for example be made by deposition of an oxide layer by lithography, followed by etching of the oxide layer depending on the required shape of the insulating areas 18.

For example, in the case in which the substrate 15 is rectangular in section, the insulating areas 18 are etched in the form of slices arranged on the silicon area 16. If the substrate 15 is circular in shape, the substrate 15 then comprises a single insulating area 18 covering part of the periphery of the silicon area 16.

Figure 4:
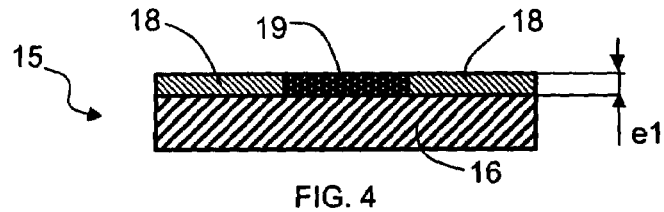

In FIG. 4, a sacrificial layer 19 made of silicon and germanium alloy is then formed, for example by selective epitaxy, in other words the sacrificial layer 19 grows starting from the part not covered by the insulating areas 18 of the silicon area 16. The thickness e1 of the sacrificial layer 19 made of silicon and germanium alloy is preferably of the order of the few nanometers, for example from 20 nm to 50 nm.

Figure 5:
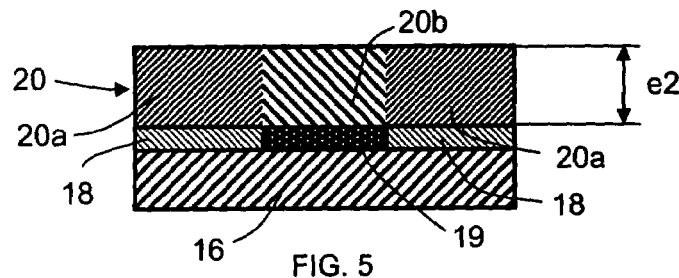

In FIG. 5, a preferably silicon very highly doped layer 20 is then formed by epitaxy. The thickness e2 of the layer 20 is predetermined, preferably of the order of 100 nm to 600 nm, and grows by epitaxy starting from the insulating areas 18 and the sacrificial layer 19. The growth rate varies depending on the areas in the silicon layer 20. The areas 20a of the layer 20 that grow starting from the insulating areas 18 are made of polycrystalline silicon, while the area 20b of the layer 20 that grows starting from the sacrificial layer 19 made of silicon and germanium alloy is made of a monocrystalline silicon.

In FIG. 5, the polycrystalline silicon areas 20a are represented by cross-hatching with lines inclined upwards towards the right and the monocrystalline silicon area 20b is represented by cross-hatching at different spacing and with lines inclined upwards towards the left. In the particular embodiment shown in FIG. 5, the limits between areas 20a and 20b are approximately vertical. In reality, growth by epitaxy generates a significantly inclined interface between the different areas.

Figure 6:
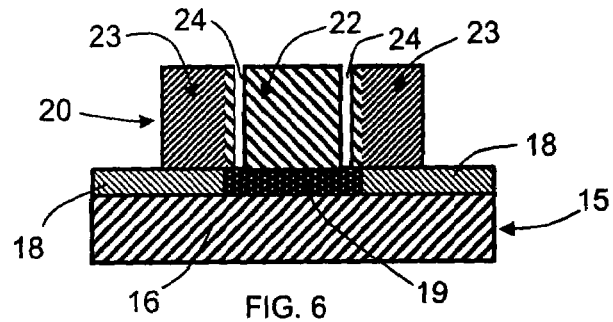

In FIG. 6, the method then includes simultaneous formation of the vibrating structure 22 of the MEMS/NEMS component 10 and also actuation electrodes 23 that will make the vibrating structure 22 vibrate in the plane parallel to the substrate 15. Formation is done by etching the silicon layer 20, preferably only at the monocrystalline area 20b. The etching step consists of etching the silicon layer 20 using a predetermined pattern designed to form spaces 24 between the vibrating structure 22 and the electrodes 23. In particular, the step to etch the electrodes 23 at the same time as etching of the vibrating structure 22, makes it possible to position the electrodes 23 and the vibrating structure 22 in a single plane parallel to the substrate 15. The electrodes 23 are formed on the insulating areas 18, they are electrically isolated from the remainder of the substrate 15 and are preferably arranged on each side of the vibrating structure 22 which thus vibrates in the plane of the substrate 15.

Furthermore, as shown in FIG. 6, the etching spaces 24 are made in the monocrystalline area 20b of the silicon layer 20, slightly separated from the insulating areas 18, particularly to avoid any alignment problem between lithography masks used for example during deposition of the different layers. Furthermore, the spaces 24 are made in the monocrystalline area 20b, such that the vibrating structure 22 is made of monocrystalline silicon only, and the electrodes 23 have a first part made of polycrystalline silicon above the insulating areas 18, and another part made of monocrystalline silicon above the sacrificial layer 19, just facing the vibrating structure 22. Thus, the vibrating structure 22 is made far from the junction area between the monocrystalline silicon and the polycrystalline silicon of the layer 20, said junction area is rich in dislocations and therefore not as good in terms of mechanical performances.

In particular, such a method with simultaneous etching of the vibrating structure 22 and electrodes 23 makes it possible to make any type of shape for the vibrating structure 22. Furthermore, the thickness of the vibrating structure 22 and electrodes 23, preferably of the order of 100 nm to 600 nm, is relatively large compared with the thickness of the beams according to prior art, so as to obtain better performances, particularly in terms of vibration quality.

For example, the vibrating structure 22 may be a longitudinal beam anchored at the central part of its longitudinal edges. In this case, the beam may be polarized by a voltage carried by these anchor points and the radiofrequency signal carried to an electrode located at one of its ends will make the beam vibrate in a longitudinal resonance mode, namely an extension of the beam along its length.

The vibrating structure 22 may also be disk shaped, anchored around its contour at four anchor points arranged regularly at 90° from each other, or anchored at its centre at a central anchor point, to form a mushroom type structure. The operating principle is the same as described above and the vibration mode of the vibrating structure 22 is then elliptical.

The vibrating structure 22 may also be a vibrating plate anchored at its four corners. The plate then deforms in compression-extension, namely two opposite parallel edges moving towards each other while the other two edges move away from each other in a first vibration mode, and conversely in a second vibration mode.

Figure 7:
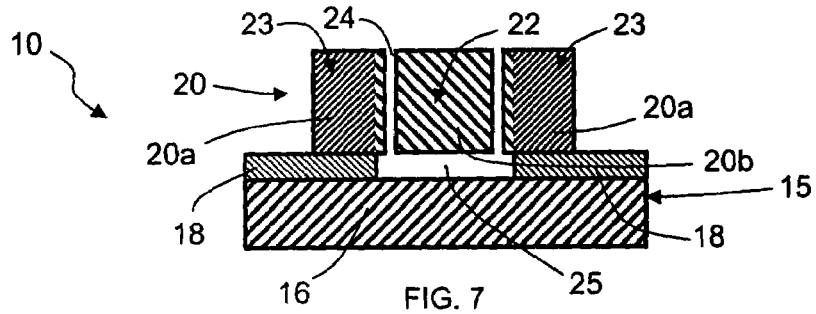

In FIG. 7, the following steps in the method for manufacturing the component 10 consists of eliminating the sacrificial layer 19 made of silicon and germanium alloy by selective etching, particularly with respect to the monocrystalline silicon of the vibrating structure 22 so as to form a space 25 above the silicon area 16. The electrodes 23 are then slightly suspended above the substrate 15 by their monocrystalline silicon parts (cross-hatching oriented upwards and towards the left) and the vibrating structure 22 is released from the substrate 15 and can vibrate in the plane, between the actuation electrodes 23.

Therefore the MEMS/NEMS type electronic component 10 thus obtained using the SON (<<Silicon On Nothing>>) technology provides a means of suspending a vibrating structure 22 that may be of any shape, thus improving its performances and introducing a gain in terms of manufacturing cost.

Figure 8:
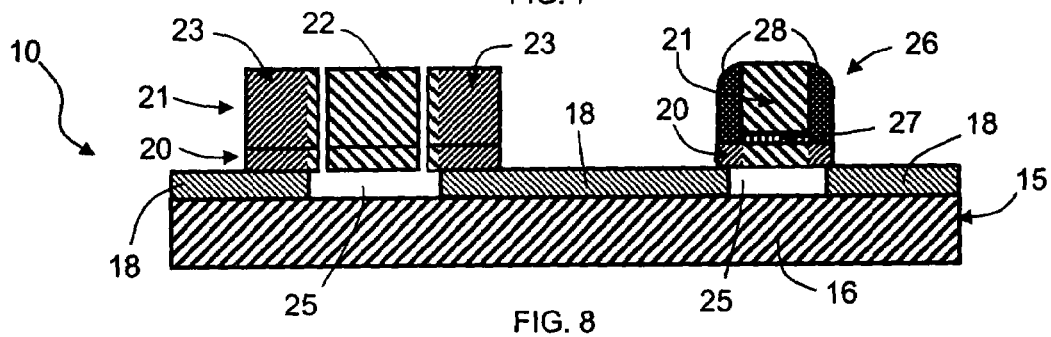
FIG. 8 is a front sectional view illustrating a variant embodiment of a method for making an electromechanical component, at the same time as a transistor is being made.

In the variant embodiment shown in FIG. 8, the method comprises manufacturing of a metal/oxide (MOS) semiconductor transistor 26, at the same time as the vibrating structure 22 and the electrodes 23 of the MEMS/NEMS component 10 described above are made. The transistor 26 is made in a conventional manner as described above using the SON technology.

In FIG. 8, the method preferably comprises deposition of an additional layer 21 made of preferably undoped silicon with a predetermined thickness, after the formation step of the strongly doped silicon layer 20. The thickness of the two layers 20, 21 is then preferably of the order of 100 nm to 600 nm. As described above, the layer 21 comprises two polycrystalline silicon areas 21a that grow starting from the polycrystalline silicon areas in the layer 20, and a monocrystalline silicon area 21b that grows starting from the monocrystalline silicon area 20a in the layer 20.

The transistor 26 then comprises the first doped silicon layer 20, forming the base of the transistor above the corresponding silicon area 16 of the substrate 15, an oxide layer 27 deposited on the layer 20 and etched before formation and etching of the additional silicon layer 21 as described above.

After etching the additional silicon layer 21, and before elimination of the sacrificial silicon and germanium alloy layer 19 designed to form the cavity 25 after elimination, the method comprises the production of spacers 28, for example made of nitride, for example made by deposition of oxide. The spacers 28 are intended particularly to protect the transistor 26 during selective etching of the corresponding sacrificial silicon and germanium alloy layer 19, that will release the transistor 26 from the substrate 15.

In the particular embodiment shown in FIG. 8, the silicon area 26 is very slightly doped. The oxide layer 27 is made by a lithography step that will define a protection for the transistor channel 26, before strongly implanting the remainder of the silicon of the layers 20, 21 to make the source and the drain (silicon layer 20) and the grid (silicon layer 21) of the transistor 26. Furthermore, the method conventionally includes tunnel filling steps using an insulating material and a large number of implantation steps and contact making steps. Therefore such a method can be used to make a MEMS/NEMS component 10 and a transistor 26 on the same plane substrate 15.

Figure 9:
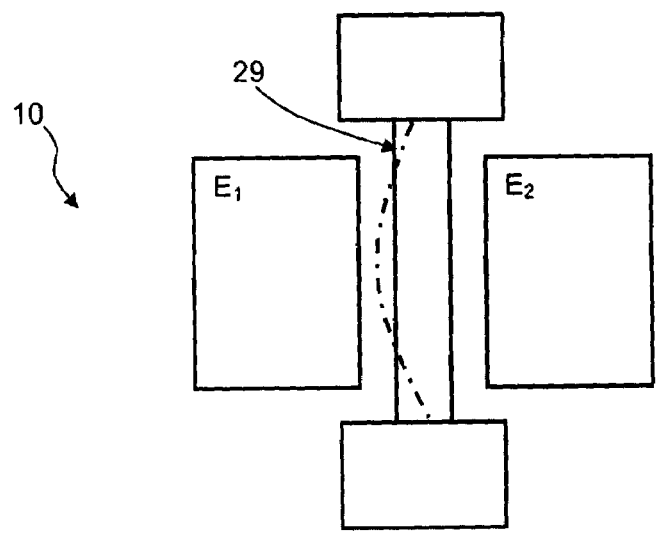
FIG. 9 is a very schematic top view of a variant embodiment of a method for making an electromechanical component.

In the variant embodiment shown in FIG. 9, the manufacturing method consists of forming MEMS or NEMS variable capacitances made of monocrystalline silicon (shown very systematically in FIG. 9). It is thus possible to make a MEMS/NEMS component 10 on the same plane support substrate 15, comprising a resonator with a vibrating structure and actuation electrodes, as described above, and also variable capacitances, in order to make integrated functions.

As shown schematically in FIG. 9 illustrating a top view of a variable capacitance, the structure formed by etching the silicon layer 20 and possibly the silicon layer 21 is in the shape for example of a built-in beam 29, showing different capacitance states as a function of the applied voltage. For example, a voltage U1 applied between the electrode E1 and the beam 29 will induce a displacement towards this electrode E1, shown schematically by the curve in dashed lines oriented towards the left in FIG. 9, without causing any electrostatic instability called <<pull-in>> implying sticking of the two electrodes E1 and E2. The capacitance between the second electrode E2 and the beam 29 will then be minimal.

By progressively lowering the voltage U1, the beam 29 will progressively return to its original position, and the capacitance value will increase. In the same way, by increasing the voltage U2 between the electrode E2 and the beam 29 uniformly, the beam will move towards the electrode E2, namely towards the right in FIG. 9 so as to vary the capacitance.

The method is thus capable of producing a beam 29 and relatively thick electrodes E1 and E2 resulting from etching of the silicon layers 20 and possibly 21, up to 600 nm. The result is an important gain in terms of capacitive performances, because the facing surfaces of the electrodes E1, E2 moving with respect to each other are thus relatively large.

Figure 10:
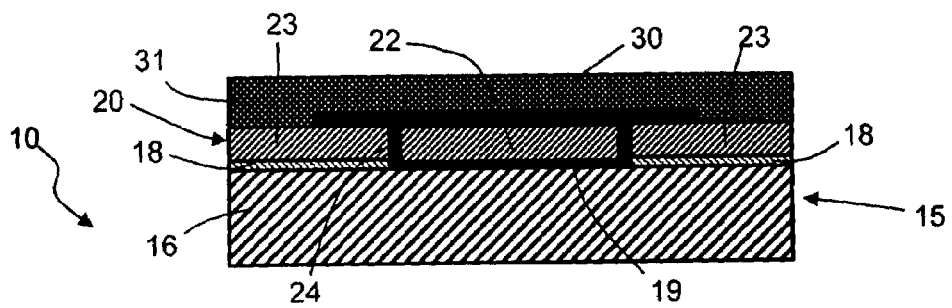
FIGS. 10 to 12 are very schematic front views illustrating a variant embodiment of a method for making an electromechanical component, provided with an encapsulation cover.
Figure 11:
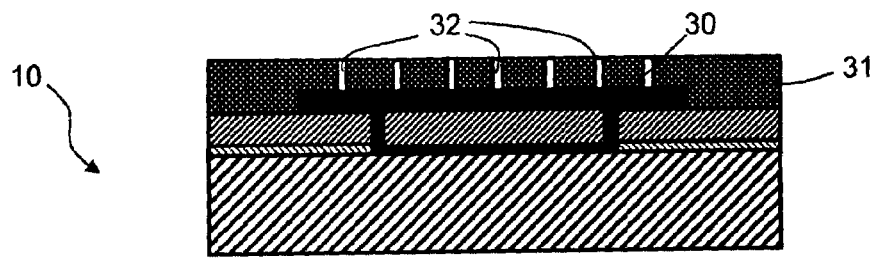
Figure 12:
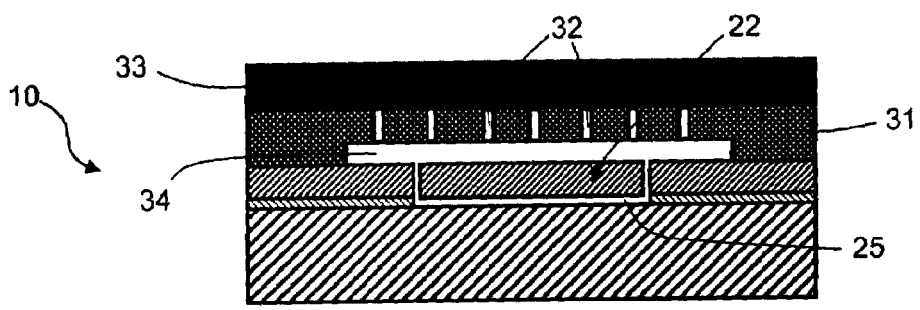

In the variant embodiment shown in FIGS. 10 to 12, the method for making an electromechanical component 10 comprises additional steps used for manufacturing an encapsulation cover of the vibrating structure 22 of the component 10, particularly for protection of the mobile vibrating structure 22 during operation and so as to assure its reliability, namely encapsulation under a vacuum or under a neutral atmosphere, such as argon or helium.

In the particular embodiment shown in FIG. 10, the component 10 is formed as above using the SON technology with the substrate 15 composed essentially of the silicon area 16 and the insulating areas 18 arranged partly on the upper surface 17 of the silicon area 16. After etching the silicon of the layer 20, and possibly the additional layer 21 (FIG. 8) to form the vibrating structure 22 and the electrodes 23, and preferably before eliminating the sacrificial silicon and germanium alloy layer 19 by etching, a new sacrificial silicon and germanium alloy layer 30 is formed, for example by epitaxy on the electrodes 23 and the vibrating structure 22. The layer 30 is preferably quite thick, of the order of 50 nm to 150 nm.

In the particular embodiment shown in FIG. 10, the material in the layer 30 closes off the spaces 24 between the electrodes 23 and the vibrating structure 22 and the layer 30 is etched to suit the required size of the cavity 34 that will be formed above the vibrating structure 22 (FIG. 12). A cover 31 is then formed for example by epitaxy of monocrystalline silicon above the monocrystalline areas made in advance (silicon and germanium alloy layer 30) and by epitaxy of polycrystalline silicon above the polycrystalline areas (electrodes 23 and insulating areas 18) made in advance.

In FIG. 11, orifices 32 are then formed in the cover 31, preferably orifices opening up as far as the sacrificial silicon and germanium alloy layer 30. Then, as shown in FIG. 12, the sacrificial silicon and germanium alloy layers 19 and 30 are eliminated by selective etching through orifices 32 of the cover 31, to release the vibrating structure 22 and form the cavity 25 below the vibrating structure 22 and a cavity 34 above the vibrating structure 22. Finally, a layer 33 made of a closing off material closes off the orifices 32 of the cover 31 above the vibrating structure 22 so as to finalise the encapsulation. The closing off material is preferably a <<nonconformed>> material, in other words capable of closing off the orifices 32 without penetrating into the cavity 34 formed in advance, for example an oxide layer, or a polycrystalline silicon or a silicon nitride layer.

Such an embodiment has the advantage of being simplified, to the extent that a single step to eliminate the sacrificial silicon and germanium alloy layers 19 and 30 by etching is necessary. Furthermore, steps to perform encapsulation are based on the same principle as for making the vibrating structure 22 and the electrodes 23, namely the SON technology. The result is a large gain in terms of cost and manufacturing time.

Therefore, regardless of which embodiment described above is used, such a method for making an electromechanical component 10 makes it possible to combine a resonator with a vibrating structure and electrodes, and a transistor and variable capacitances on the same substrate by the same layer deposition and etching steps. Any type of shape causing vibration in the plane can be made to produce the vibrating structure 22 and to optimise its performances, particularly in terms of high resonant frequency and high quality factor. Furthermore, selective encapsulation is possible indifferently for each vibrating structure 22.

The invention is not limited to the different embodiments described above. In particular, the vibrating structure 22 of the MEMS/NEMS component 10 obtained by the manufacturing method according to the embodiment may be annular in shape. Furthermore, the MEMS/NEMS component 10 may be an accelerometer. In this case, seismic masses are inserted while reducing the stiffness of the anchor. Resonators coupled by the method can also be made.

The embodiment shown in FIGS. 3 to 7 may also comprise a step to deposit an additional silicon layer 21, provided that the thickness of the two layers 20, 21 made of silicon is of the order of 100 nm to 600 nm.

In one variant embodiment not shown, the substrate 15 as shown in FIG. 3 may be made differently and it may comprise a silicon area 16 at the same level as the insulating areas 18. The first step in formation of the substrate 15 in the method then comprises etching of the silicon area 16, deposition of insulating areas 18 in the grooves corresponding to the etching done in advance, and a levelling step of the substrate 15 thus obtained. The insulating areas 18 are then integrated into the substrate 15 and the upper surface of the silicon area 16 not covered by the substrate 15 is then at the same level as the upper surface of the insulating areas 18.

The next steps in the method then take place in the same way as above with formation of the sacrificial silicon and germanium alloy layer 19, which projects slightly above the substrate 15 (of the order of a few nanometers or a few tens of nanometers) and the formation of the silicon layer 20, preferably strongly doped. After simultaneous etching of the electrodes 23 and the vibrating structure 22 in the monocrystalline area 20b of the silicon layer 20, there is then a slight difference in the height between the vibrating structure 22 made of monocrystalline silicon and the parts of electrodes 23 made of polycrystalline silicon. This height difference, typically the height of the sacrificial layer 19, then has no incidence on operation and performances of the component 10, to the extent that the parts of the electrodes 23 facing the vibrating structure 22 are made of monocrystalline silicon and therefore are at the same height as the vibrating structure 22 (FIG. 7).

In another variant embodiment not shown in FIGS. 10 to 12, the second sacrificial silicon and germanium alloy layer 30 may be deposited after etching the vibrating structure 22 and the electrodes 23, in other words after the vibrating structure 22 has been released. The material from which the silicon and germanium alloy layer 30 is made then closes off only the ends of the spaces 24 between the vibrating structure 22 and the electrodes 23 during its deposition, and the encapsulation cover 31 is then formed as described above, with etching only the silicon and germanium alloy layer 30 to release the cover 31.

The method may be applied to any type of electromechanical component requiring simultaneous production of a vibrating structure, in same plane as its actuation electrodes.

The invention claimed is:

1. Method for making an electromechanical component on a plane substrate and comprising at least one structure vibrating in the plane of the substrate and actuation electrodes, the method comprising at least the following steps in sequence:
   formation of the substrate comprising at least one silicon area provided with an upper surface at least partly covered by one insulating area,
   formation of a sacrificial silicon and germanium alloy layer by selective epitaxy starting from the uncovered part of the upper surface of the silicon area,
   formation of a silicon layer with a predetermined thickness by epitaxy, comprising at least one monocrystalline area arranged on said sacrificial layer and at least one polycrystalline area arranged on said insulating area,
   simultaneous formation of the vibrating structure and actuation electrodes, by etching a predetermined pattern in the monocrystalline area designed to form spaces between the electrodes and the vibrating structure,
   elimination of said sacrificial layer made of silicon and germanium alloy, by selective etching.

2. Method according to claim 1, the silicon layer being strongly doped.

3. Method according to claim 1, the thickness of the vibrating structure and the electrodes of the electromechanical component being of the order of 100 nm to 600 nm.

4. Method according to claim 1, comprising a step to make an encapsulation cover for the vibrating structure of the electromechanical component.

5. Method according to claim 4, said step to make the encapsulation cover comprising the following steps after simultaneous formation of the vibrating structure and electrodes by etching:
   formation of a second sacrificial silicon and germanium alloy layer, by epitaxy,
   formation of a monocrystalline silicon layer by epitaxy, intended to form the encapsulation cover,
   formation of a plurality of orifices by etching in the cover,
   elimination of first and second sacrificial silicon and germanium alloy layers by selective etching through said orifices,
   formation of a layer made of a closing off material on the cover.

6. Method according to claim 1, comprising formation of an additional undoped silicon layer by epitaxy starting from the first silicon layer, before the simultaneous formation of the vibrating structure and the electrodes.

7. Method according to claim 6, comprising the formation of a metal/oxide semiconductor transistor, at the same time as the vibrating structure and the electrodes.

8. Method according to claim 1, comprising the formation of variable capacitances at the same time as the vibrating structure and the electrodes.

* * * * *